US006207347B1

(12) United States Patent
Lundy et al.

(10) Patent No.: US 6,207,347 B1
(45) Date of Patent: *Mar. 27, 2001

(54) PHOTOIMAGEABLE COMPOSITION HAVING IMPROVED FLEXIBILITY

(75) Inventors: Daniel L. Lundy, Pomona; Nitin J. Negandhi, Covina, both of CA (US)

(73) Assignee: Nichigo-Morton Co. Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/301,963

(22) Filed: Apr. 29, 1999

Related U.S. Application Data

(63) Continuation-in-part of application No. 09/087,059, filed on May 29, 1998.

(51) Int. Cl.[7] .............................. G03F 7/028; G03F 7/029; G03F 7/031; G03F 7/027
(52) U.S. Cl. ...................... 430/284.1; 522/95; 430/277.1
(58) Field of Search ............................... 430/284.1, 277.1; 522/95

(56) References Cited

U.S. PATENT DOCUMENTS

| | | | |
|---|---|---|---|
| 3,782,961 | * | 1/1974 | Takahashi et al. ................. 96/115 R |
| 4,019,972 | * | 4/1977 | Faust ................................ 204/159.15 |
| 4,248,958 | * | 2/1981 | Faust ................................. 430/288.1 |
| 4,702,997 | * | 10/1987 | Ai et al. ........................ 430/284.1 X |
| 5,328,804 | | 7/1994 | Podszun et al. ..................... 430/283 |

FOREIGN PATENT DOCUMENTS

586743a1    8/1992   (EP) .............................. G03F/7/028

* cited by examiner

*Primary Examiner*—Cynthia Hamilton

(57) ABSTRACT

The invention provides a negative-acting photoimageable composition comprising A) between about 30 and about 80 wt % based on total weight of A) plus B) of a binder polymer having acid functionality sufficient to render said photoimageable composition developable in alkaline aqueous solution, B) between about 20 and about 70 wt % based on total weight of A) plus B) of an addition-polymerizeable, non-gaseous $\alpha,\beta$-ethylenically unsaturated compound(s) capable of forming a high polymer by free-radical initiated chain-propagating addition polymerization, at least about 50 mole percent of the $\alpha,\beta$-ethylenically unsaturated moieties of B) being methacrylic moieties, and C) between about 0.1 and about 20 wt % based on total weigh of A) plus B) of a photoinitiator chemical system. Photopolymerizable component B comprises, at between about 1 and about 70 wt. % relative to total of A) plus B) a biuret urethane oligomer having $\alpha,\beta$-ethylenic unsaturation.

8 Claims, No Drawings

PHOTOIMAGEABLE COMPOSITION HAVING IMPROVED FLEXIBILITY

This is a continuation-in-part of copending application Ser. No. 09/087,059, filed on May 29, 1998, pending.

The present invention is directed to negative-acting photoimageable compositions such as those used as photoresists in the art of printed circuitry. The photoimageable composition contains, as a portion of its photoimageable component, a urethane biuret oligomer.

BACKGROUND OF THE INVENTION

This invention is directed to negative-acting photoimageable compositions which are developable in alkaline aqueous solutions. The invention is particularly applicable to primary photoimaging resists, but is applicable, as well, to compositions that are hardenable so as to form solder masks and the like.

A variety of such photoimageable compositions are described. Essential compositions of the type to which the present invention is directed are A) a binder polymer; B) photopolymerizable $\alpha,\beta$-ethylenically unsaturated compound(s), and C) a photoinitiator chemical system. The binder polymer A) has sufficient acid functionality, generally carboxylic acid functionality, that the binder polymer is soluble in alkaline aqueous solution and thereby renders the photoimageable composition developable in alkaline aqueous solutions. The photopolymerizeable compound(s) B) are monomers and/or short chain oligomers, a substantial portion of which have multiple $\alpha,\beta$-ethylenic unsaturated functionality.

The photoinitiator chemical system C) includes chemicals which generate free radicals upon exposure to actinic radiation. These free radicals propagate the polymerization of the $\alpha,\beta$-ethylenic unsaturated moieties of the photopolymerizeable compounds B). Herein, the photoinitiator system C) is deemed to include not only chemical compounds which generate free radicals, but catalysts or sensitizers which promote the free-radical initiated polymerization of the $\alpha,\beta$-ethylenic unsaturated moieties of the photopolymerizeable compounds B).

Circuit boards almost invariably have through-holes to connect circuitry on opposite faces of the board. With holes becoming larger on circuit boards, higher tenting strength is becoming increasingly important; thus greater flexibility of photoimageable compositions is required.

Improved flexibility also contributes to an improved cross hatch adhesion which allows for better compatibility with automated polyester removal systems. If the photoresist is brittle, these polyester removal systems will cause chipping of the photoresist and subsequently, circuit line defects.

By replacing a portion of conventional photo reactive monomers (like ethoxylated trimethylolpropane triacrylate) with an isocyanuric, urethane-based oligomer, a significant improvement to tenting strength and flexibility was observed. However, even though the flexibility was noticeably better, the fine line adhesion was not improved and the oligomer was shown to be a major source of developing scumming.

Improved fine line adhesion and lower developer scum has been demonstrated when the isocyanuric oligomer is comprised of the product of a polyethoxymonomethacrylate and the isocyanurate trimer of hexamethylene diisocyanate, as described, for example, in European Patent Application EP 0 738927 A2 and Japanese Patent Document JP 08-2868372. The use of the product of a polyalkoxymonomethacrylate in UV-curable photoresists enhances the performance of such compositions over those made with urethane compounds based on the isocyanurate trimer of hexamethylene diisocyanate. Present day commercial requirements include further improvements to both fine line adhesion and developer scumming.

Herein, urethane biuret oligomers are incorporated as at least a portion of the photopolymerizeable component B). The urethane biuret oligomers are found to minimize the developer scum. Along with improving the developer scum problem, it has been found that urethane biuret oligomers improve the fine line adhesion of the photoresist.

SUMMARY OF THE INVENTION

The present invention is directed to a negative-acting photoimageable composition comprises A) between about 30 and about 80 wt %, based on total weight of A) plus B) of an organic polymeric binder having sufficient acid functionality to render the photoimageable composition developable in alkaline aqueous solution, B) between about 20 and about 70 wt % based on total weight of A) plus B) of addition-polymerizeable, non-gaseous $\alpha,\beta$-ethylenically unsaturated compounds capable of forming a polymer by free-radical initiated chain-propagating addition polymerization, and C) between about 0.1 and about 20 wt % relative to total weight of A) plus B) of an organic, radiation-sensitive free-radical generating chemical system activatable by actinic radiation to initiate chain-propagating addition polymerization of the addition-polymerizeable material. In accordance with the invention, component B) comprises between about 1 and about 70 wt %, based on total weight of A) plus B) of a biuret urethane oligomer having the general formula:

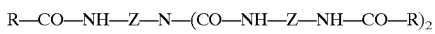

R—CO—NH—Z—N—(CO—NH—Z—NH—CO—R)$_2$ where the R's are the same or different and have the general formula:

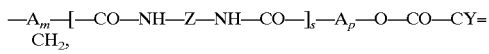

—A$_m$—[—CO—NH—Z—NH—CO—]$_s$—A$_p$—O—CO—CY=CH$_2$, where m=6–20, p=0–20, s=0–1;
the A's are the same or different and are selected from the group consisting of;

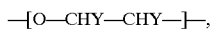

—[O—CHY—CHY—]—, where the Ys are the same or different and are selected from the group consisting of H, CH$_3$, or C$_2$H$_5$,

—[O—(CH$_2$)$_{3-4}$—]—,

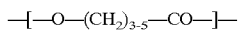

—[—O—(CH$_2$)$_{3-5}$—CO—]— and mixtures thereof; and
Z is a divalent alkyl, cycloalkyl, aromatic, or alkylaromatic hydrocarbon moiety.

In the formula above, it is important that m equal at least 6 to obtain the requisite flexibility of the photoimageable composition. U.S. Pat. No. 4,019,972 describes photoimageable compositions containing similar photopolymerizable compounds. However, in the examples of this patent, in the corresponding compounds, m=1. This patent further explicitly teaches in Column 5, lines 9–14, that it is disadvantageous for m to be 5 or greater. Contrary to the teaching of U.S. Pat. No. 4,019,972, it is found that improved flexibility is increased without loss of adhesion to the copper substrate. If m is not equal to at least 6, more brittle compositions result.

Where it is stated above that the A's are the same or different, it is meant that the A's may be the same or different in any one oligomer molecule or may be the same or different within any one R group. If the A's are different within any one R group, the different A's may be randomly distributed or the different A's may be in blocks.

In the general formulae above, simple examples of Z include hexamethylene, phenylene, and cyclohexylene, although more complex divalent hydrocarbon moieties are also suitable. The choice of Z is generally not considered to be particularly critical, the selection generally depending upon the commercial availability of suitable precursors.

DETAILED DESCRIPTION OF CERTAIN PREFERRED EMBODIMENTS

Herein, unless otherwise noted, all percentages are weight percentages. Component A) (the binder polymer) and Component B) (the photoimageable compounds) which are herein considered to equal 100 wt %, and other components, including the components of the photoinitiator chemical system, being based on total weight of A) plus B).

The invention is directed to photoimageable compositions which are developable in alkaline aqueous solution and which therefore have substantial acid functionality. Such photoimageable compositions typically have a binder A) having acid functionality, typically an acid number of at least about 80, preferably at least about 100 and more preferably about 150 or more, up to about 250. The acid functionality is typically carboxylic acid functionality, but may also include, for example, sulfonic acid functionality or phosphoric acid functionality. Binder polymers for photoimageable compositions typically have weight average molecular weights between about 20,000 and about 200,000, preferably at least about 80,000.

The polymers are typically derived from a mixture of acid functional monomers and non-acid functional monomers. Some specific examples of suitable acid functional monomers are acrylic acid, methacrylic acid, maleic acid, fumaric acid, citraconic acid, 2-acrylamido-2-methylpropanesulfonic acid, 2-hydroxyethyl acrylolyl phosphate, 2-hydroxypropyl acrylol phosphate, 2-hydroxy-alpha-acryloyl phosphate, etc. One or more of such acid functional monomers may be used to form the binder polymer.

The acid functional monomers may be copolymerized with non-acid functional monomers, such as esters of acrylic acid and methacrylic acid, for example, methyl acrylate, 2-ethyl hexyl acrylate, n-butyl acrylate, n-hexyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate; styrene and substituted styrene, such as 2-methyl styrene and vinyl toluene and vinyl esters, such as vinyl acrylate and vinyl methacrylate to provide the desired acid number.

The amount of the binder polymer A) may vary over a wide range, typically comprising between about 30 to about 80 wt % of the composition based on total weight of A) plus B).

Examples of such polymers and photoimageable compositions using such polymers are found, in the following U.S. Pat. Nos. 3,953,309, 4,003,877, 4,610,951, and 4,695,527 the teaching of each of which are incorporated herein by reference.

The photopolymerizable component B) described above having photopolymerizable poly $\alpha,\beta$-ethylenic unsaturation comprises between 5 and about 100 wt % of the urethane biuret oligomer, preferably between about 25 and about 75 wt % of B), i.e., between 1 and about 70 wt %, preferably between about 5 and about 52.5 wt % relative to total of A) plus B).

Synthesis of hexamethylenediisocyanate (HDI) urethane biuret oligomer is analogous to the preparation of urethane compounds prepared with the isocyanurate trimer of HDI. The polyisocyanate is reacted with an acrylate- or methacrylate-terminated alcohol at or near stoichiometrically equivalent levels. The resulting compound is a trifunctional urethane acrylate/methacrylate oligomer which is then used as part of B), the addition-polymerizable, non-gaseous, $\alpha,\beta$-ethylenically unsaturated compounds.

The balance of photopolymerizeable component B), i.e., between 0 and about 95 wt %, preferably between about 25 and about 75 wt %, of B), i.e., between 0 and about 69 wt %, preferably between about 5 and about 52.5 wt %, relative to total of A) plus B) is typically a monomer, dimer or short chain oligomer having ethylenic unsaturation, particularly, $\alpha,\beta$-ethylenic unsaturation, including monofunctional compounds and compounds having $\alpha,\beta$-ethylenic unsaturation functionality 2 or greater. Typically, a mixture of monofunctional and multi-functional monomers will be used. Suitable photopolymerizeable compounds include, but are not limited to, the monomers recited above as suitable for forming binder polymers, particularly the non-acid functional compounds. The total amount of photopolymerizeable component B) is typically between about 20 and about 70 wt % of the photoimageable composition based on total weight of A) plus B).

To initiate polymerization of the monomers upon exposure to actinic radiation, the photoimageable composition contains a photoinitiator chemical system. Generally, the photoinitiator chemical system comprises between about 0.1 and about 20 wt % based on total weight of A) plus B). Photoinitiator chemicals include, but are not limited to 9-phenylacridine, n-phenyl glycine, aromatic ketones (benzophenone, N,N'-tetramethyl-4,4'-diaminobenzophenone [Michler's ketone], N,N'-tetraethyl-4,4'-diaminobenzophenone,4-methoxy-4'-dimethylaminobenzophenone, 3,3'-dimethyl-4-methoxybenzophenone, p,p'-bis(dimethylamino) benzophenone, p,p'-bis(diethylamino)-benzophenone, anthraquinone, 2-ethylanthraquinone, naphthaquinone, phenanthraquinone, benzoins (benzoin, benzoinmethylether, benzoinethylether, benzoinisopropylether, benzoin-n- butylether, benzoin-phenylether, methylbenzoin, ethybenzoin, etc.), benzyl derivatives (dibenzyl, benzyldiphenyldisulfide, benzyldimethylketal (SIC), etc.), acridine derivatives (9-phenylacridine, 1,7-bis(9-acridinyl) heptane, etc.), thioxanthones (2-chlorothioxanthone, 2-methylthioxanthone, 2,4-diethylthioxanthone, 2,4-dimethylthioxanthone, 2-isopropylthioxanthone, etc.), acetophenones (1,1-dichloroacetophenone, p-t-butyldichloroacetophenone, 2,2-diethoxyacetophenone, 2,2-dimethoxy-2-phenylacetophenone, 2,2-dichloro-4-phenoxyacetophenone, etc.), etc. Though, not a free-radical generator, triphenylphosphene may be included in the photoinitiator chemical system as a catalyst.

The photoimageable composition may advantageously include one or more plasticizers at between about 0.5 and about 10 wt % based on total weight of A) plus B). Examples of suitable plasticizers include, but are not limited to, phthalate esters (e.g., dibutylphthalate, diheptylphthalate, dioctylphthalate, diallylphthalate), glycols (e.g., polyethylene-glycol, polypropyleneglycol), glycol esters (e.g., triethylene-glycoldiacetate, tetraethyleneglycoldiacetate, dipropyleneglycol-dibenzoate), phosphate esters (tricresylphosphate, tripheynlphosphate), amides (p-toluenesulfoneamide, benzenesulfoneamide, N-n-butylacetoneamide), aliphatic dibasic acid esters (diisobutyl-adipate, dioctyladipate, dimethylsebacate, dioctylazelate, dibutylmalate, triethylcitrate, tributylcitrate, triethylacetylcitrate, tri-n-propylacetylcitrate, tri-n-butylacetylcitrate, butyl-laurate, dioctyl-4,5-diepoxycyclohexane-1,2-dicarboxylate, glycerinetriacetylesters.

Additionally, the photoimageable compositions may contain a wide variety of additional components as are known in the art, including additional polymers, such as those which might be used to effect a final hardened cure of a solder mask, dyes, color formers, stabilizers, flexibilizing agents, fillers etc.

Processing of the photoimageable composition is in a conventional manner. In a typical procedure, a photoimageable composition layer, either formed from a liquid composition or transferred as a layer from a dry film, is applied to a copper surface of a copper-clad board. The photoimageable composition layer is exposed to actinic radiation through appropriate artwork. Exposure to actinic radiation polymerizes the monomer in the light-exposed areas, resulting in a cross-linked structure that is resistant to developer. Next, the composition is developed in dilute alkaline aqueous solution, such as a 1% sodium carbonate solution. The alkali solution causes salt formation with the carboxylic groups of the binder polymers, rendering them soluble and removable. After development, an etchant may be used to remove copper from those areas where the resist was removed, thereby forming a printed circuit. The remaining resist is then removed using an appropriate stripper.

The invention provides a fine line (less than 75 microns) resist sidewall which adheres well to copper surfaces.

The invention will now be described in greater detail by way of specific examples.

EXAMPLES

A base photoimageable composition was formulated as follows:

| Component | Wt %* |
|---|---|
| 1. Terpolymer of methylmethacrylate, butylacrylate methyl-methacrylic acid (Acid No. 150, wt. average molecular weight 80,000) | 56.7 |
| 2. Ethoxylated bisphenol A dimethacrylate | 14.4 |
| 3. Polypropylene glycol methacrylate | 12.2 |
| 4. Urethane oligomer (A), (B), (C), or (D)** | 16.7 |
| 5. p-toluene sulfonamide (plasticizer) | 5.0 |
| 6. Triphenylmethane dye | 0.056 |
| 7. 9-phenylacridine (photoinitiator) | 0.17 |

*Components 1–4 calculated as 100 wt %; remaining components calculated relative to components 1–4.
**The Urethane Oligomers examples above are as follows:

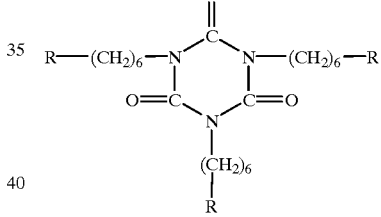
(Comparative Example A and C)

R—(CH$_2$)$_6$—N—(CO—NH—(CH$_2$)$_6$—R)$_2$    (Examples B and D)
R = —NH—CO—O—(—CHX—CH$_2$—O)$_6$—CO—C(CH$_3$)=CH$_2$,
where X is H or CH$_3$;
X = H (Examples A and B);
X = CH$_3$ (Examples C and D).

Properties of the photoimageable compositions are described in Table I below:

TABLE 1

| Urethane Oligomer Component (8) | Ethoxylated trimethactylate urethane of HDI isocyanurate (A) | Ethoxylated trimethacrylate urethane of HDI biuret (B) | Propoxylated trimethacrylate urethane of HDI isocyanurate (C) | Propoxylated trimethacrylate urethane of HDI biuret (D) |
|---|---|---|---|---|
| Resolution(1) at Step 7(2) and 2× Break point(3) | 45 | 40 | 47 | 43 |
| Resolution(1) at Step 7(2) and 4× Break point(3) | 52 | 45 | 45 | 45 |
| Resolution at Step 9(2) and 4× Break point | 75 | 65 | 75 | 70 |
| Adhesion(1) at Step 7(2) and 4× Break point | 55 | 45 | 55 | 55 |
| Adhesion(1) at Step 9(2) and 4× Break point | 35 | 25 | 25 | 22 |
| Tent Strength(4) at Step 7(2), dry(5) | 179 | 252 | 247 | 268 |

TABLE 1-continued

| Urethane Oligomer Component (8) | Ethoxylated trimethactylate urethane of HDI isocyanurate (A) | Ethoxylated trimethacrylate urethane of HDI biuret (B) | Propoxylated trimethacrylate urethane of HDI isocyanurate (C) | Propoxylated trimethacrylate urethane of HDI biuret (D) |
|---|---|---|---|---|
| Tent Strength(4) at Step 9(2), dry(5) | 276 | 340 | 291 | 315 |
| Tent Strength(4) at Step 7(2), wet(6) | 485 | 592 | 389 | 421 |
| Tent Strength(4) at Step 9(2), wet(6) | 545 | 571 | 412 | 536 |
| Stripping Time(7) at Step 7(2) | 40 | 38 | 39 | 34 |
| Cross Hatch Resistance(10) at Step7(2), 4× Break Point | 25 | 30 | — | — |
| Cross Hatch Resistance(10) at Step9(2), 2× Break Point | 15 | 20 | — | — |
| Stripping Time(7) at Step 9(2) | 48 | 42 | 45 | 44 |
| Stripping Time(7) at Step 7(2) after Sn Plating | 66 | 57 | — | — |
| Stripping Time(7) at Step 9(2) after Sn Plating | 84 | 70 | — | — |
| Sn Underplating(9) at Step 7(2) | 0.61 | 0.53 | — | — |
| Sn Underplating(9) at Step 9(2) | 0.33 | 0.35 | — | — |

Of the above results, most noteworthy is the increase in tenting strength of (B) and (D) relative to (A) and (C).

Compounds E and F (comparative) were formulated having a single ethoxy unit, as compared with 6 of the present invention, i.e., (E), (F) R=—NH—CO—O—CH$_2$—CH$_2$—O—CO—C(CH$_3$)=CH$_2$ in the isocyanurate (E) and biuret Formulations given above. That is (E)=(A) where m=1 instead of 6; (F)=(B) where m=1 instead of 6. The results are summarized in Table 2 below; it being noted that comparative examples (E) and (F) exhibit poor tenting strength:

TABLE 2

| Urethane Oligomer Component (8) | Monoethoxylated trimethacrylate urethane of HDI isocyanurate (E) | Monoethoxylated trimethacrylate urethane of HDI biuret (F) |
|---|---|---|
| Resolution(1) at Step 7(2) and 2× Break point(3) | 41 | 43 |
| Resolution(1) at Step 7(2) and 4× Break point(3) | 30 | 31 |
| Resolution at Step 9(2) and 2× Break point | 60 | 61 |
| Adhesion(1) at Step 7(2) and 4× Break point | 32 | 45 |
| Adhseion(1) at Step9(2) and 2× Break point | 24 | 24 |
| Tent Strength(4) at Step 7(2), dry(5) | — | — |
| Tent Strength(4) at Step 9(2), dry(5) | 88.5 | 74 |
| Tent Strength(4) at Step 7(2), wet(6) | — | — |
| Tent Strength(4)at Step 9(2), wet(6) | 66 | <20 |
| Cross Hath Resistance(10) at step7(2), 4× Break Point | <5 | <5 |
| Cross Hatch Resistance(10) at Step9(2), 2× Break Point | <5 | <5 |
| Stripping Time(7) at Step 7(2) | — | — |
| Stripping Time(7) at Step9(2) | — | — |
| Stripping Time(7) at Step7(2) after Sn Plating | 64 | 48 |
| Stripping Time(7) at Step9(2) after Sn Plating | 90 | 62 |
| Sn Underplating(9) at Step7(2) | 0.48 | 0.67 |
| Sn Underplating(9) at Step9(2) | 0.32 | 0.36 |

(1) Minimum observed in microns, resolution as equal lines and spaces, adhesion as lines with a 400 micron spacing.
(2) Stouffer 21 solid step
(3) Developing at 30° C. in 1% sodium carbonate monohydrate
(4) Puncture strength with a 2 mm radius tipped probe through a tented 6 mm hole
(5) Hot air knife dried after developing and held at room temperature, 30% RH for 16 hours
(6) After 4 minute immersion in 20° C. tap water
(7) In seconds, conveyorized spray with 55° C. 3% sodium hydroxide solution
(8) As a 15% by weight component of 38 micron thick dry film photoresist formulation (see Attachment #2 for chemical structure, Attachment #3 for trial formulation)
(9) Mils of plating ingress between photoresist and copper interface after-plating up 1 mil of tin.
(10) Amount of photoresist remaining adhered after cross scoring with a multibladed knife at 1 mm spacing
NOTE: At a Step 9 (optimum crosslinking) there is no degredation, or increase, of underplating as a result of higher alkoxylation when comparing A and E, or B and F.

What is claimed is:
1. A negative-acting photoimageable composition comprising
A) between about 30 and about 80 wt % based on the total weight of A) plus B) of a binder polymer having acid functionality sufficient to render said photoimageable composition developable in alkaline aqueous solution,
B) between about 20 and about 70 wt % based on the total weight of A) plus B) of an addition-polymerizable, non-gaseous α,β-ethylenically unsaturated compound(s) capable of forming a high polymer by free-radical initiated chain-propagating addition polymerization, said component B comprising between about 1 and about 70 wt %, based on total of A) plus B) of a urethane biuret oligomer having the formula:

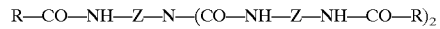

R—CO—NH—Z—N—(CO—NH—Z—NH—CO—R)$_2$ where the R's are the same or different and have the general formula:

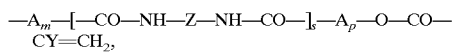

where m=6–20, p=0–20, s=0–1; the A's are the same or different and are selected from the group consisting of

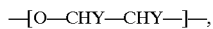

where the Y's are the same or different and are selected from the group consisting of H, $CH_3$, or $C_2H_5$,

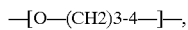

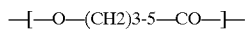

and mixtures thereof; and Z is a divalent alkyl, cycloalkyl, aromatic, or alkylaromatic hydrocarbon moiety; and (C) a photoinitiator chemical system.

2. The composition according to claim 1 wherein said urethane biuret oligomer comprises between about 5 and about 52.5 wt % based on total weight of A) plus B).

3. The composition of claim 1 wherein the photoinitiator chemical system comprises between about 0.1 and about 20 wt %, based on the total weight of A) plus B).

4. The composition of claim 1 wherein the photoinitiator chemical system is selected from 9-phenylacridine, n-phenyl glycine, benzophenone, N,N'-tetramethyl-4,4'-diaminobenzophenone, N,N'-tetraethyl-4,4'-diaminobenzophenone, 4-methoxy-4'-dimethylaminobenzophenone, 3,3'-dimethy-4-methoxybenzophenone, p,p'-bis(dim ethylamino) benzophenone, p,p'-bis(diethylamino)benzophenone, anthraquinone, 2-ethylanthraquinone, naphaquinone, phenanthraquinone, benzoin, benzoin methyl ether, benzoin ethyl ether, benzoin isopropyl ether, benzoin n-butyl ether, benzoin phenyl ether, methylbenzoin, ethylbenzoin, dibenzyl, benzyldiphenyldisulfide, benzyldimethylketal, 1,7-bis(9-acridinyl)heptane, 2-chlorothioxanthone, 2-methylthioxanthone, 2,4-diethylthioxanthone, 2,4-dimethylthioxanthone, 2-isopropylthioxanthone, 1,1-dichloroacetophenone, p-t-butyldichloroacetophenone, 2,2-diethoxyacetophenone, 2,2-dimethoxy-2-phenylacetophenone or 2,2-dichloro-4-phenoxyacetophenone.

5. The composition of claim 1 further comprising one or more plasticizers.

6. The composition of claim 5 wherein the plasticizer is selected from phthalate esters, glycols, glycol esters, phosphate esters, amides or aliphatic dibasic acid esters.

7. The composition of claim 5 wherein the one or more plasticizers comprise from about 0.5 to about 10 wt %, based on the total weight of A) plus B).

8. The composition of claim 1 wherein m=6.

* * * * *